(12) United States Patent
Tocchio (10) Patent No.: US 10,209,269 B2
(45) Date of Patent: Feb. 19, 2019

(54) Z-AXIS MICROELECTROMECHANICAL DETECTION STRUCTURE WITH REDUCED DRIFTS

(71) Applicant: STMICROELECTRONICS S.R.L., Agrate Brianza (IT)

(72) Inventor: Alessandro Tocchio, Gessate (IT)

(73) Assignee: STMICROELECTRONICS S.R.L., Agrate Brianza (IT)

( * ) Notice: Subject to any disclaimer, the term of this patent is extended or adjusted under 35 U.S.C. 154(b) by 73 days.

(21) Appl. No.: 14/858,563

(22) Filed: Sep. 18, 2015

(65) Prior Publication Data

US 2016/0169931 A1 Jun. 16, 2016

(30) Foreign Application Priority Data

Dec. 11, 2014 (IT) .............................. TO2014A1029

(51) Int. Cl.
*G01P 15/02* (2013.01)
*G01P 15/125* (2006.01)
(Continued)

(52) U.S. Cl.
CPC ............ *G01P 15/02* (2013.01); *B81B 7/0048* (2013.01); *G01C 19/5712* (2013.01);
(Continued)

(58) Field of Classification Search
CPC ..... G01P 2015/0831; G01P 2015/0834; G01P 2015/0837
See application file for complete search history.

(56) References Cited

U.S. PATENT DOCUMENTS 6,450,031 B1 *  9/2002  Sakai ................... B81B 3/0086
                                                        73/514.16
7,121,141 B2   10/2006  McNeil
(Continued)

FOREIGN PATENT DOCUMENTS

CN  101657728 A  2/2010
CN  101981457 A  2/2011
(Continued)

OTHER PUBLICATIONS

Liu et al., "Wafer-level Adhesive Bonding with Benzocyclobutene for the Accelerometer," Electronic Sci. & Tech., No. 25, Issue 9, 2012, pp. 9-12.

*Primary Examiner* — Lisa Caputo
*Assistant Examiner* — Herbert K Roberts
(74) *Attorney, Agent, or Firm* — Seed IP Law Group LLP (57) ABSTRACT

Described herein is a microelectromechanical detection structure, provided with: a substrate having a top surface extending in a plane; a detection-electrode arrangement; an inertial mass, suspended above the substrate and the detection-electrode arrangement; and elastic elements, coupling the inertial mass to a central anchorage element fixed with respect to the substrate, in such a way that it is free to rotate about an axis of rotation as a function of a quantity to be detected along a vertical axis, the central anchorage element being arranged at the axis of rotation. A suspension structure is coupled to the detection-electrode arrangement for supporting it, suspended above the substrate and underneath the inertial mass, and is anchored to the substrate via at least one first anchorage region; the fixed-electrode arrangement is anchored to the suspension structure via at least one second anchorage region.

17 Claims, 5 Drawing Sheets

(51) Int. Cl.
  *G01C 19/5712* (2012.01)
  *B81B 7/00* (2006.01)
  *G01P 15/08* (2006.01)

(52) U.S. Cl.
  CPC .... *G01P 15/125* (2013.01); *B81B 2201/0235* (2013.01); *B81B 2201/0242* (2013.01); *G01P 2015/0831* (2013.01); *G01P 2015/0837* (2013.01)

(56) References Cited

U.S. PATENT DOCUMENTS

| | | | |
|---|---|---|---|
| 7,640,805 | B2 | 1/2010 | Diamond et al. |
| 8,020,443 | B2 | 9/2011 | Lin et al. |
| 8,198,715 | B2 | 6/2012 | Laming et al. |
| 8,610,222 | B2 | 12/2013 | Lin et al. |
| 8,752,430 | B2 | 6/2014 | Burghardt et al. |
| 2002/0170355 | A1 | 11/2002 | Malametz |
| 2010/0175473 | A1* | 7/2010 | Classen ................ G01P 15/125 73/514.29 |
| 2011/0023604 | A1 | 2/2011 | Cazzaniga et al. |
| 2011/0174074 | A1 | 7/2011 | Li et al. |
| 2013/0319117 | A1 | 12/2013 | McNeil et al. |
| 2014/0374849 | A1* | 12/2014 | Lin ................... G01C 19/5712 257/415 |
| 2016/0139172 | A1* | 5/2016 | Scheurle ............... G01P 15/125 73/514.32 |
| 2017/0108530 | A1 | 4/2017 | Tocchio et al. |

FOREIGN PATENT DOCUMENTS

| | | |
|---|---|---|
| CN | 102203001 A | 9/2011 |
| CN | 203825034 U | 9/2014 |
| EP | 2514712 A2 | 10/2012 |
| JP | 2001-41973 A | 2/2001 |

\* cited by examiner

FIG. 1
(Known Art)

FIG. 2A
(Known Art)

FIG. 2B
(Known Art)

Z-AXIS MICROELECTROMECHANICAL DETECTION STRUCTURE WITH REDUCED DRIFTS

BACKGROUND

Technical Field

The present disclosure relates to a z-axis MEMS (Micro-Electro-Mechanical System) detection structure.

Description of the Related Art

Z-axis inertial accelerometers of a MEMS type are known, which include microelectromechanical structures sensitive to accelerations acting in a direction orthogonal to a main plane of extension thereof and to the top surface of a corresponding substrate of semiconductor material (in addition possibly to being able to detect further accelerations acting in the same plane).

Figure 1:
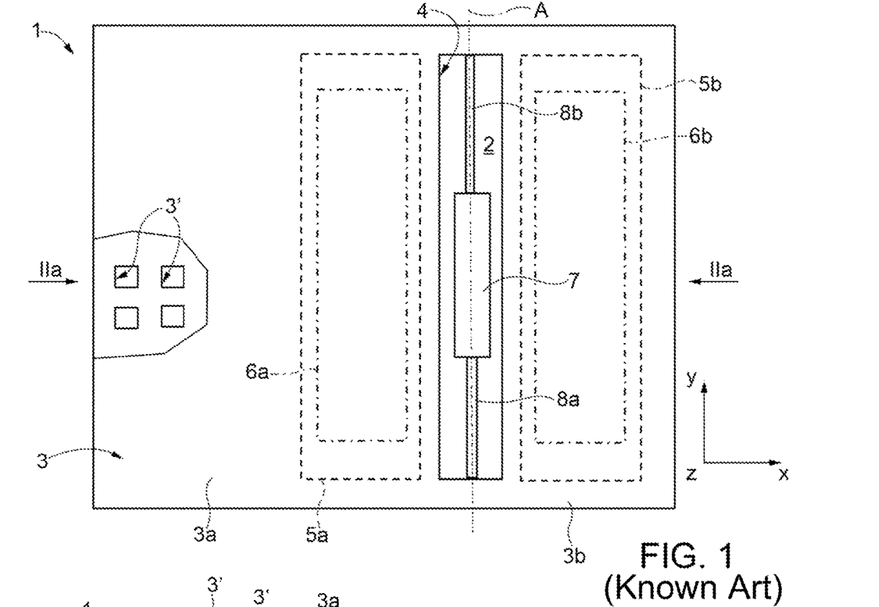
FIG. 1 is a schematic plane view of a MEMS structure of a z-axis detection device, of a known type.
Figures 2A, 2B:
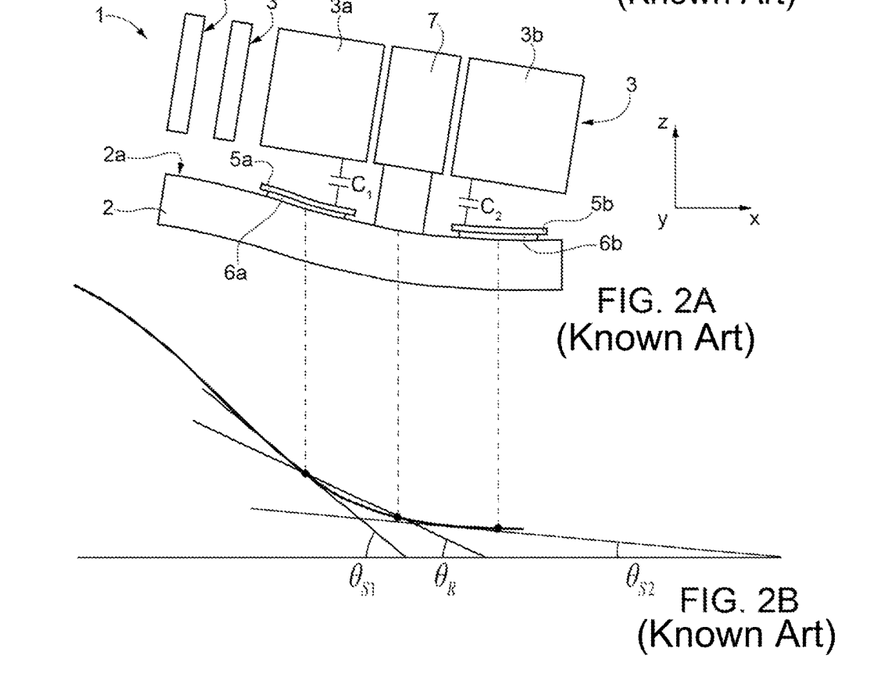
FIG. 2A is a cross-sectional view of the MEMS structure of FIG. 1 in the presence of a deformation of the corresponding substrate, along line of section IIa-IIa of FIG. 1.
FIG. 2B shows schematically angles associated to the deformation of the substrate of the MEMS structure of FIG. 2A.

FIG. 1 and FIG. 2A show a MEMS structure of a known type, designated as a whole by reference number 1, belonging to a z-axis inertial accelerometer (which further comprises an electronic reading circuit, not illustrated, electrically coupled to the MEMS structure).

The MEMS structure 1 comprises a substrate 2 of semiconductor material, in particular silicon, having a top surface 2a, and an inertial mass 3, which is of conductive material, for example, appropriately doped epitaxial silicon, and is arranged above the substrate 2, suspended at a certain distance from its top surface 2a.

The inertial mass 3 has a main extension in a horizontal plane xy, which is defined by a first axis x and a second axis y, which are orthogonal to one another, and is substantially parallel to the top surface 2a of the substrate 2 (in resting conditions, i.e., in the absence of accelerations or external stresses acting on the MEMS structure 1), and a substantially negligible dimension along an orthogonal axis z, which is perpendicular to the aforesaid horizontal plane xy (and to the aforesaid top surface 2a of the substrate 2) and forms with the first and second axes x, y a set of three Cartesian axes xyz.

The inertial mass 3 has a through opening, defining a window 4, which traverses it throughout its thickness, has in plane view a substantially rectangular shape extending in length along the second axis y, and is arranged at a certain distance from the centroid (or center of gravity) of the inertial mass 3. The window 4 consequently divides the inertial mass 3 into a first portion 3a and a second portion 3b, which are arranged on opposite sides with respect to the window itself along the first axis x, the first portion 3a having a dimension along the first axis x that is larger as compared the second portion 3b.

The inertial mass 3 further has a plurality of holes 3', of very small size as compared to the aforesaid window 4, which traverses it throughout its thickness, enabling, during manufacturing process, release of the inertial mass 3 (and consequent suspended arrangement over the substrate 2) by chemical etching of an underlying sacrificial material (in a way not illustrated herein).

The MEMS structure 1 further comprises a first detection electrode 5a and a second detection electrode 5b, which are of conductive material, for example, polysilicon, are arranged on the top surface 2a of the substrate 2, on opposite sides with respect to the window 4 along the first axis x, to be positioned respectively underneath the first and second portions 3a, 3b of the inertial mass 3. The first and second detection electrodes 5a, 5b have in top plane view, in a plane parallel to the horizontal plane xy, a substantially rectangular shape, elongated along the second axis y.

The first and second fixed electrodes 5a, 5b are directly anchored to the substrate 2 by respective anchorage regions 6a, 6b, which are, for example, of dielectric material and are arranged between the top surface 2a of the substrate 2 and the electrodes themselves. The anchorage regions 6a, 6b have substantially the same conformation (rectangular in top plane view) and dimensions as the respective detection electrodes 5a, 5b.

The first and second fixed electrodes 5a, 5b define, together with the inertial mass 3, a first detection capacitor and a second detection capacitor with plane and parallel faces, the capacitances of which are designated by $C_1$, $C_2$, respectively, and have a given value of capacitance at rest (i.e., in the absence of displacement of the inertial mass 3).

The inertial mass 3 is anchored to the substrate 2 by a central anchorage element 7, constituted by a column or pillar element extending within the window 4, at the center thereof, starting from the top surface 2a of the substrate 2. The central anchorage element 7 is consequently equidistant from the fixed electrodes 5a, 5b along the first axis x, and corresponds to the single point of constraint of the inertial mass 3 to the substrate 2.

In particular, the inertial mass 3 is mechanically connected to the central anchorage element 7 by a first elastic anchorage element 8a and a second elastic anchorage element 8b, which are referred to hereinafter for simplicity as "springs" and extend within the window 4, aligned, with a substantially rectilinear extension, along an axis of rotation A parallel to the second axis y, on opposite sides with respect to the central anchorage element 7. Each spring 8a, 8b extends between the central anchorage element 7 and a side portion of the inertial mass 3 facing the window 4.

The springs 8a, 8b are designed to be compliant to torsion around their direction of extension, thus enabling rotation of the inertial mass 3 out of the horizontal plane xy, about the axis of rotation A defined by the same springs 8a, 8b.

During operation, in the presence of an acceleration acting along the orthogonal axis z, the inertial mass 3 rotates, by inertial effect, around the axis of rotation A approaching one of the two detection electrodes 5a, 5b (for example, the first detection electrode 5a) and correspondingly moving away from the other of the two detection electrodes 5a, 5b (for example, from the second detection electrode 5b), thus generating opposed variations of the detection capacitances $C_1$, $C_2$.

The value of the detection capacitances $C_1$, $C_2$ depends, among other parameters, upon the size of the detection electrodes 5a, 5b (which are desired to have a sufficient extension in plane view), and the capacitive variation depends, among other parameters, upon the distance of the detection electrodes 5a, 5b from the axis of rotation A (the distance has to be, in fact, sufficient to cause an appreciable variation of the gap between the inertial mass 3 and the detection electrodes 5a, 5b).

A suitable reading electronics (not shown in FIG. 1) of the accelerometer, electrically coupled to the MEMS structure 1, receives at its input the capacitive variations of the detection capacitors $C_1$, $C_2$, and processes the same variations in a differential way (as a function of the difference $C_2$-$C_1$) for determining the value of acceleration acting along the orthogonal axis z.

The present Applicant has realized that the MEMS structure 1 described previously, albeit advantageously enabling detection of accelerations acting along the orthogonal axis z, may be subject to even relevant errors of measurement in the case where the substrate 2 undergoes deformation, for example, as the temperature varies or on account of mechanical stresses.

In a known way, the package of a microelectromechanical sensor is in fact subject to deformation as the temperature varies, which is due to the different coefficients of thermal expansion of the materials of which it is made, thus causing corresponding deformation of the substrate of the MEMS structure contained therein. Similar deformations may occur on account of particular stresses induced from outside, for example, when the package is soldered on a printed circuit, or due to absorption of humidity by the package constituent materials.

As shown schematically in FIG. 2a, in the presence of deformation of the substrate 2, the detection electrodes 5a, 5b, directly constrained thereto (these electrodes are in general formed on the top surface 2a of the same substrate 2) follow this deformation, whereas the inertial mass 3 is displaced by the inertial effect, tilting by a detection angle $\theta_r$ (measured with respect to the first axis x). Due to deformation, variations of the distances (or gaps) between the inertial mass 3 and the detection electrodes 5a, 5b thus arise and consequent variations of the detection capacitances $C_1$, $C_2$.

The present Applicant has thus realized that the deformation of the substrate 2 may cause a drift of the DC value, referred to "zero-g level" or "offset", of the accelerations detected, directed along the orthogonal axis z.

In detail, reference may be made by way of example to FIGS. 2a and 2b (which are not drawn to scale; namely, the value of the angles is increased for purely illustrative purposes in FIG. 2b), which illustrate a generic cross-section of the z-axis detection structure along the axis x.

A deformation (which may be considered in the example a cubic deformation), of the substrate 2 and of the corresponding top surface 2a, causes inclination of the top surface of the detection electrodes 5a and 5b by deviation angles $\theta_{s1}$ and $\theta_{s2}$, respectively (it should be noted that each of these angles corresponds to the tangent to the curve of deformation of the substrate 2 at the center of each electrode for the cross-section along the first axis x considered).

It may happen that, on account of the deviation angles $\theta_{s1}$ and $\theta_{s2}$, differential capacitive variations of the detection capacitors $C_1$, $C_2$ that are not desired (in so far as they are not linked to the inertial effect) occur:

$$\Delta C_1 \alpha \theta_r - \theta_{s1}$$

$$\Delta C_2 \alpha \theta_r - \theta_{s2}$$

The resulting offset on the differential detection is thus given by the following expression:

$$\text{offset} = \Delta C_2 - \Delta C_1 \alpha \theta_{s1} - \theta_{s2}$$

and is variable as a function of the temperature, or in general of all those effects that are able to induce deformations of the substrate 2, and directly proportional to the difference between the deviation angles $\theta_{s1}$ and $\theta_{s2}$.

BRIEF SUMMARY

The present disclosure relates to a z-axis MEMS (Micro-Electro-Mechanical System) detection structure, which has reduced drifts in response to variations of temperature or to external stresses, in particular induced in the detection structure via interaction with the corresponding package. The following discussion will make explicit reference, without this implying any loss of generality, to a z-axis microelectromechanical capacitive accelerometer.

One or more embodiments of the present disclosure may solve one or more of the problems highlighted previously and in particular to provide a microelectromechanical structure sensitive along the orthogonal axis z having reduced drifts of its electrical characteristics in response to thermal variations or mechanical stresses of various natures. According to one embodiment of the present disclosure, a microelectromechanical structure is consequently provided. The microelectromechanical structure includes a substrate having a top surface extending in a plane and a central anchorage element fixed with respect to said substrate. The structure further includes a detection-electrode arrangement and an inertial mass suspended above said substrate and at least partially facing said detection-electrode arrangement. Elastic elements couple the inertial mass to the central anchorage element. The elastic elements are configured to support said inertial mass so that the inertial mass is free to rotate about an axis of rotation as a function of a quantity to be detected along a vertical axis that is transverse to said plane, the central anchorage element being arranged at said axis of rotation. The structure further includes first and second anchorage regions and a suspension structure coupled to the detection-electrode arrangement. The suspension structure is configured to support said detection-electrode arrangement in a position that is suspended above said substrate and below said inertial mass. The suspension structure is anchored to the substrate by at least the first anchorage region and the detection-electrode arrangement is anchored to said suspension structure by at least the second anchorage region.

BRIEF DESCRIPTION OF THE SEVERAL VIEWS OF THE DRAWINGS

For a better understanding of the present disclosure, a preferred embodiment thereof is now described, purely by way of non-limiting example and with reference to the attached drawings, wherein.

DETAILED DESCRIPTION

As will be described in detail in what follows, one aspect of the present solution envisages providing the MEMS structure in such a way that the anchorage regions associated to the detection electrodes are arranged in proximity of or at the central anchorage element associated to the inertial mass in such a way as to minimize the deformations perceived by the same detection electrodes in the presence of deformation of the substrate. The differential deformations between the mobile mass and the detection electrodes are in fact minimized if evaluated in the proximity of the central anchorage element (see also previous FIGS. 2A and 2B).

In one embodiment, the aforesaid anchorage regions associated to the detection electrodes may be arranged in the proximity of the central anchorage element associated to the inertial mass, as much as allowed by the techniques and the manufacturing process used for manufacturing the MEMS structure.

With reference to the schematic representation of FIG. 3 and to the corresponding cross-sections of FIGS. 4A and 4C (where elements similar to others already described are designated by the same reference numbers and are not described again), the MEMS structure, here designated by 10, of a z-axis detection device (for example, an accelerometer), differs from the structure described with reference to FIG. 1 substantially as regards to the presence of a suspension structure 12, which is arranged inside the window 4 and is configured to support in a suspended way the detection electrodes 5a, 5b over the substrate 2 and underneath the inertial mass 3 (i.e., at a certain, non-zero, distance from the top surface 2a of the substrate 2).

The detection electrodes 5a, 5b, which have a conformation substantially similar to the solution represented in FIG. 1 (in such a way as not to modify the detection characteristics, for example in terms of sensitivity to external accelerations), are kept substantially parallel to the surface 2a of the substrate 2 (in the absence of deformations of the same substrate 2) and of the inertial mass 3 (in the absence of inertial displacements of the same inertial mass 3).

The suspension structure 12 is anchored to the substrate 2 at first anchorage regions 14a, 14b arranged in proximity of the central anchorage element 7 and of the axis of rotation A of the inertial mass 3. Moreover, the detection electrodes 5a, 5b are anchored to the suspension structure 12 at second anchorage regions 16, which extend between the same detection electrodes 5a, 5b and the suspension structure 12.

In other words, the detection electrodes 5a, 5b are indirectly anchored to the substrate 2, centrally at the axis of rotation A, and in a position close to the central anchorage element 7 of the inertial mass 3, by a two-level anchorage structure, which includes: a first anchorage level, constituted by the first anchorage regions 14a, 14b, which are arranged between the top surface 2a of the substrate 2 and the suspension structure 12; and a second anchorage level, constituted by the second anchorage regions 16, which are arranged between the suspension structure 12 and the detection electrodes 5a, 5b.

In particular, the first anchorage regions 14a, 14b include a column element, or pillar, which extends between the top surface 2a of the substrate 2 and the suspension structure 12, while the second anchorage regions 16 include a respective column element, or pillar, which extends between the suspension structure 12 and a respective detection electrode 5a, 5b.

Figure 4A:
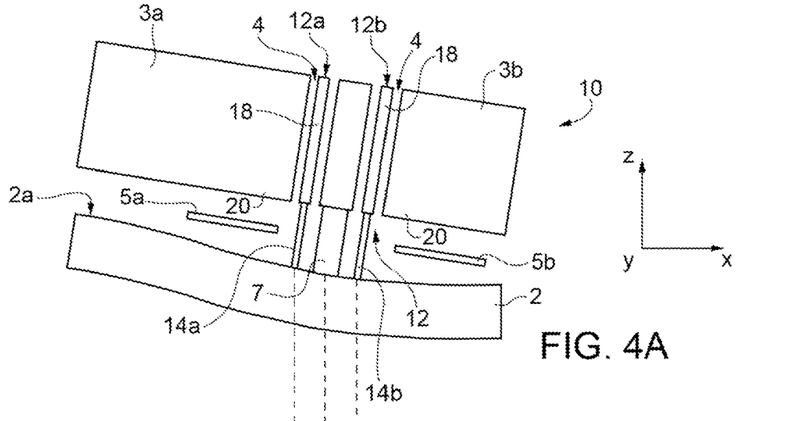
FIG. 4A is a cross-sectional view of the MEMS structure of FIG. 3 in the presence of deformation of the corresponding substrate, taken along line of section IVa-IVa of FIG. 3.
Figure 4B:
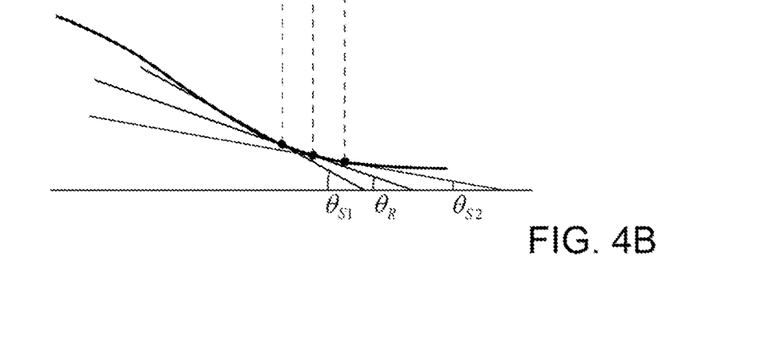
FIG. 4B is a schematic illustration of angles associated to the deformation of the substrate of the MEMS structure of FIG. 4A.

As illustrated schematically in FIG. 4B (which is again not drawn to scale, for reasons of clarity of illustration), the deviation angles $\theta_{s1}$ and $\theta_{s2}$ associated to the detection electrodes 5a, 5b are in this case measured in a position corresponding to the median axis of the first anchorage regions 14a, 14b (or, in other words, to the center of the same first anchorage regions 14a, 14b in the section along the first axis x), thus in the proximity of the axis of rotation A.

The difference between the values of the deviation angles $\theta_{s1}$ and $\theta_{s2}$ is thus markedly reduced (the two angles are in fact substantially equal), thus causing a reduced offset on the detected value of capacitance difference $\Delta C$ (see also the foregoing discussion).

Advantageously, the presence of the suspension structure 12 thus enables reduction of the drift without limiting the dimensions in plane view of the detection electrodes 5a, 5b (as compared to known solutions, for example the solution of FIG. 1), preventing any significant reduction of sensitivity in detection along the axis z.

In greater detail, in one embodiment (illustrated in the aforesaid FIG. 3), the suspension structure 12 is arranged inside the window 4 defined within the inertial mass 3 and has a first suspension portion 12a and a second suspension portion 12b, which are arranged on opposite sides of the axis of rotation A, symmetrically with respect thereto.

Each suspension portion 12a, 12b has a comb-shaped conformation, with a body 18 that has an extension parallel to the axis of rotation A along the second axis y and is arranged alongside and in the proximity of the springs 8a, 8b; and arms 19, which extend starting from the body 18, in a direction transverse thereto (in the example, along the first axis x).

In particular, the body 18 of the suspension portions 12a, 12b is centrally coupled to a respective first anchorage region 14a, 14b, which constrains the same body 18 to the substrate 2, in proximity of the central anchorage element 7. In particular, the body 18 is anchored at the first anchorage region 14a, 14b, and otherwise is suspended with respect to the substrate 2.

In the embodiment illustrated, the first anchorage regions 14a, 14b are arranged, along the first axis x, alongside the central anchorage element 7, at a distance c from the same central anchorage element 7 (the distance c is calculated between the median axis of the first anchorage regions 14a, 14b and the axis of rotation A, along the first axis x).

In one embodiment, the distance c may be between 20 μm and 50 μm.

Moreover, the anchorage regions 14a, 14b and the central anchorage element 7 are arranged along the median axis of the inertial mass, directed parallel to the first axis x.

The aforesaid distance c is smaller than the distance d between the median axis of the detection electrodes 5a, 5b and the axis of rotation A, along the first axis x; for example, the distance c is between ⅙ and ½, in particular between ⅕ and ⅓, of the distance d.

The arms 19 of the suspension portions 12a, 12b carry respective second anchorage regions 16, which extend between the detection electrodes 5a, 5b and the same arms 19.

Figure 3:
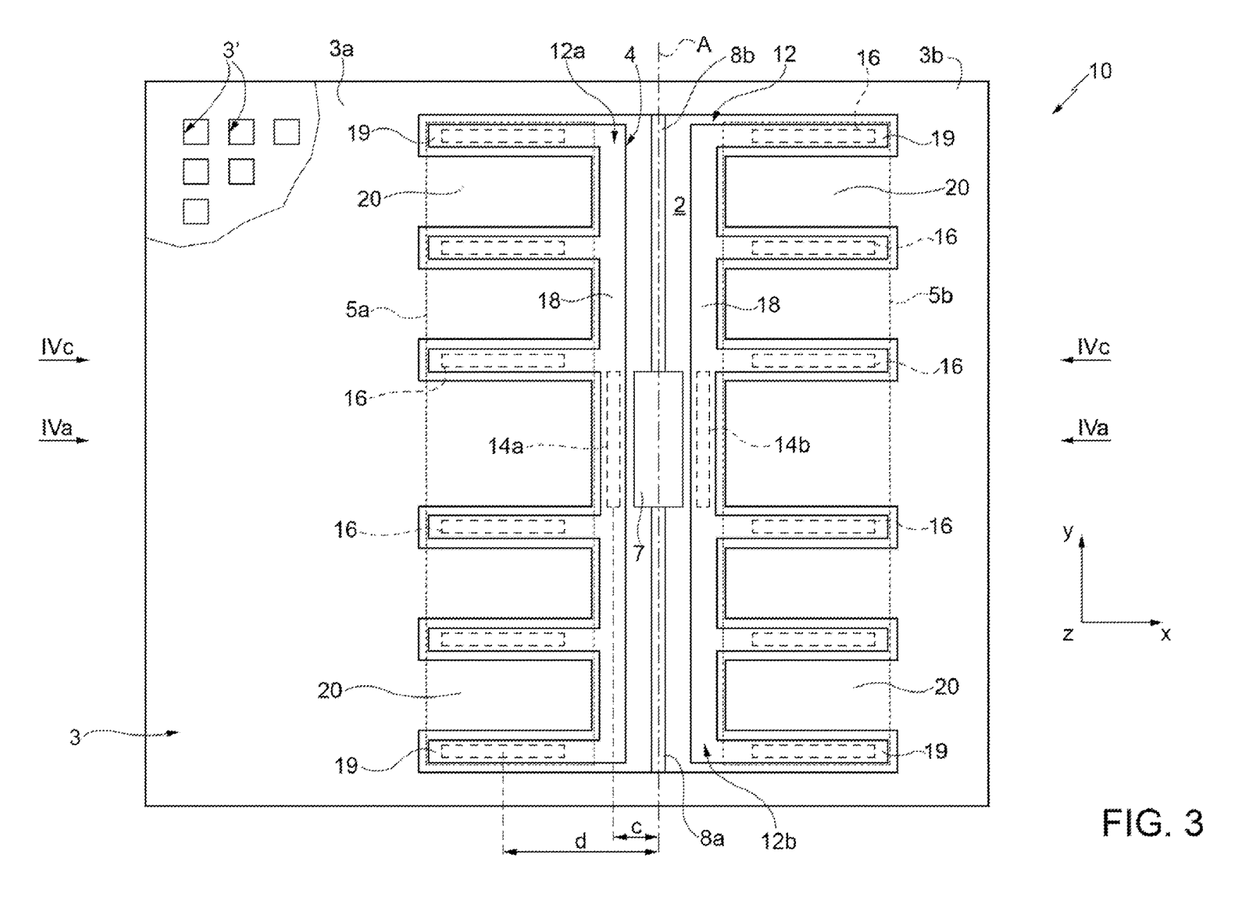
FIG. 3 is a schematic plane view of a MEMS structure of a z-axis detection device, according to one aspect of the present solution.
Figure 4C:
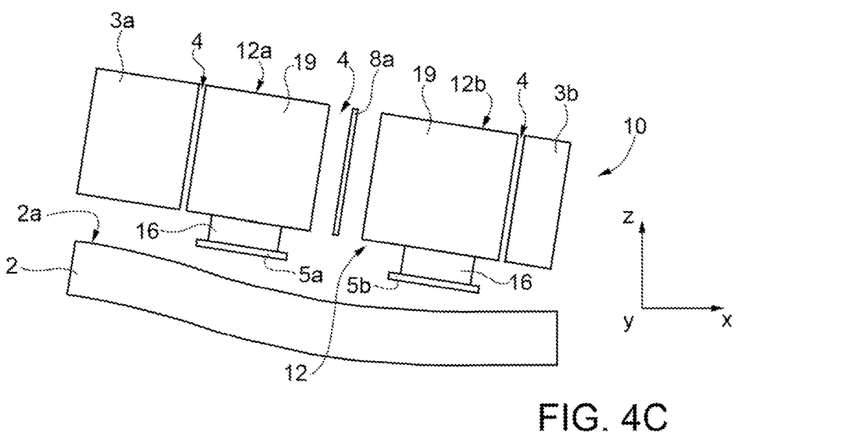
FIG. 4C is a cross-sectional view of the MEMS structure of FIG. 3 in the presence of deformation of the corresponding substrate, taken along line of section IVc-IVc of FIG. 3.

In the embodiment illustrated in FIG. 3, each arm 19 carries a corresponding second anchorage region 16. However, it is evident that some of the arms 19 could be without coupling with the underlying detection electrode 5a, 5b. It may be advantageous for at least the two arms 19 arranged at the ends of the suspension portions 12a, 12b (along the second axis y) to carry respective second anchorage regions 16 for coupling to the underlying detection electrode 5a, 5b (in such a way as to guarantee its arrangement in a direction substantially parallel to the inertial mass 3, in resting conditions).

Moreover, in the embodiment illustrated in FIG. 3, the inertial mass 3 has a conformation that is combfingered with the arms 19 of the suspension portions 12a, 12b, within the window 4, having, at the corresponding first and second portions 3a, 3b a plurality of fingers 20, combfingered with respective arms 19 of the suspension portions 12a, 12b.

The detection electrodes 5a, 5b are thus arranged underneath the fingers 20 of the inertial mass 3, carried in a suspended manner over the substrate 2 by the respective suspension portion 12a, 12b.

The advantages of the proposed microelectromechanical detection structure emerge clearly from the foregoing description.

In any case, it is emphasized once again that the present solution enables minimization of the drifts in the electrical performance of the MEMS structure 10, due to deformation of the substrate 2, on account, for example, of temperature variations or mechanical stresses, for instance deriving from soldering of the corresponding electronic device to a printed circuit or causes of any other nature.

The MEMS structure 10 is in this way extremely stable, irrespective of the operating conditions and of the assembly conditions in the corresponding package.

The general detection performance, in terms, for example, of sensitivity, are not jeopardized as compared to traditional solutions, given that the detection mechanism is not modified, just as the conformation and arrangement of the detection electrodes 5a, 5b with respect to the inertial mass 3 are not substantially modified.

The solution described does not even envisage substantial modifications to the flow of the manufacturing process normally used, since it basically adopts the same steps of growth and selective etching of layers of material above the substrate 2.

Figure 5:
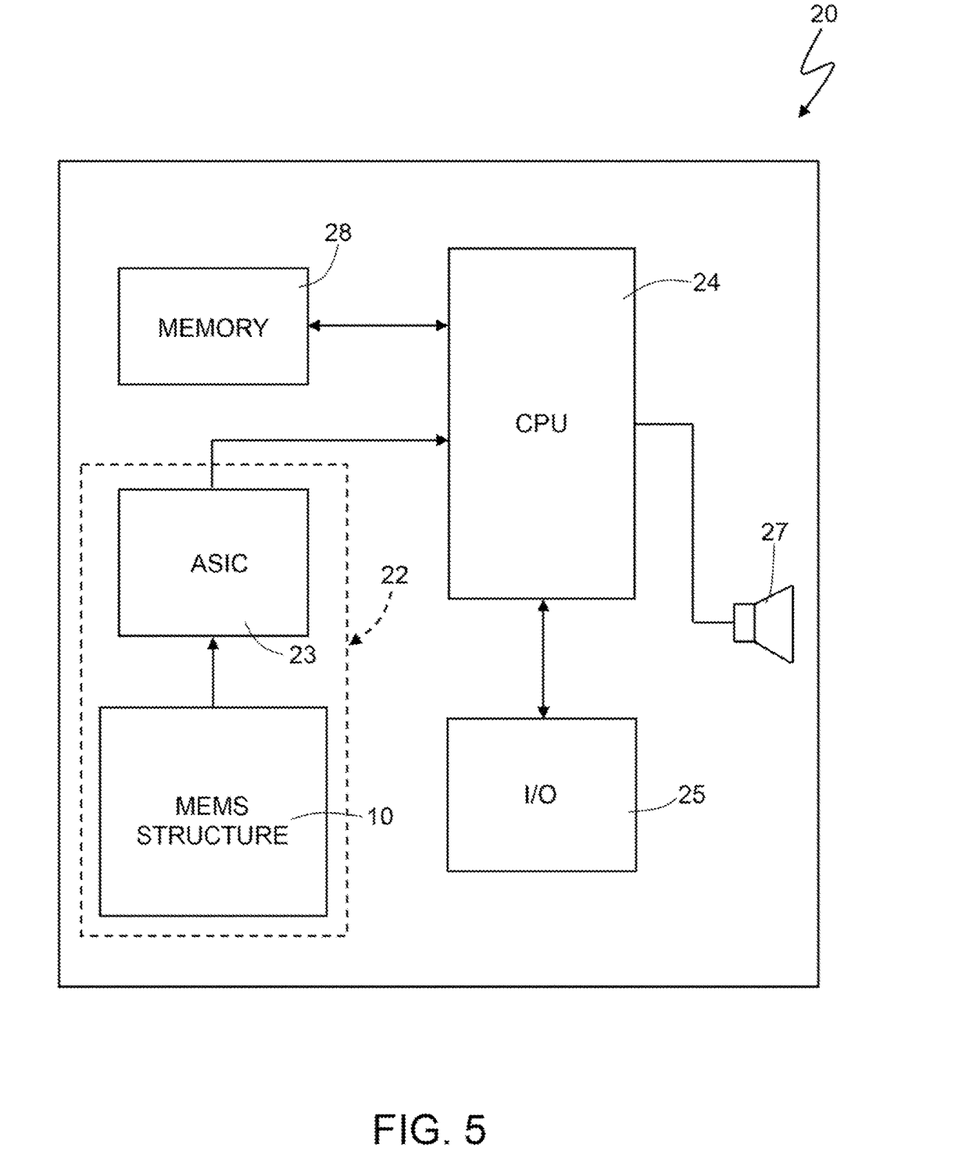
FIG. 5 is a schematic block diagram of an electronic device incorporating the MEMS structure, according to one embodiment of the present solution.

The above advantages thus render particularly advantageous use of the MEMS structure 10 and of the corresponding z-axis acceleration sensor in an electronic device 20, as illustrated in FIG. 5. In particular, in FIG. 5, the microelectromechanical sensor is designated by 22, and includes the MEMS structure 10 described previously and an ASIC 23, which provides the corresponding reading interface (and may be obtained in the same die in which the MEMS structure 10 is obtained or in a different die, which may in any case be housed in the same package).

The electronic device 20 is preferably a mobile-communication portable device, such as, for example, a mobile phone, a PDA (personal digital assistant), a portable computer, but also a digital audio player with voice-recording capacity, a photographic camera or video camera, a controller for videogames, etc., the electronic device 20 being generally able to process, store, and/or transmit and receive signals and information.

The electronic device 20 comprises a microprocessor 24, which receives the acceleration signals detected by the microelectromechanical sensor 22, and an input/output interface 25, for example provided with a keypad and a display, connected to the microprocessor 24. Furthermore, the electronic device 20 may comprise a speaker 27, for generating sounds on an audio output (not shown), and an internal memory 28.

The microelectromechanical sensor 22 may, for example, be used for applications of inertial navigation, without Global Positioning System (GPS) or assisted by GPS.

Finally, it is clear that modifications and variations may be made to what has been described and illustrated herein without thereby departing from the scope of the present disclosure.

In particular, some aspects of the MEMS structure 10 could vary, without these entailing substantial modifications to the solution proposed for anchorage and suspension of the detection electrodes 5a, 5b.

For example, it is evident that the number of arms 19 of each suspension portion 12a, 12b of the suspension structure 12 could vary with respect to what is illustrated purely by way of example. In addition, as previously mentioned, the number of second anchorage regions 16 associated to the arms 19 could be different from what has been illustrated herein.

Figure 6:
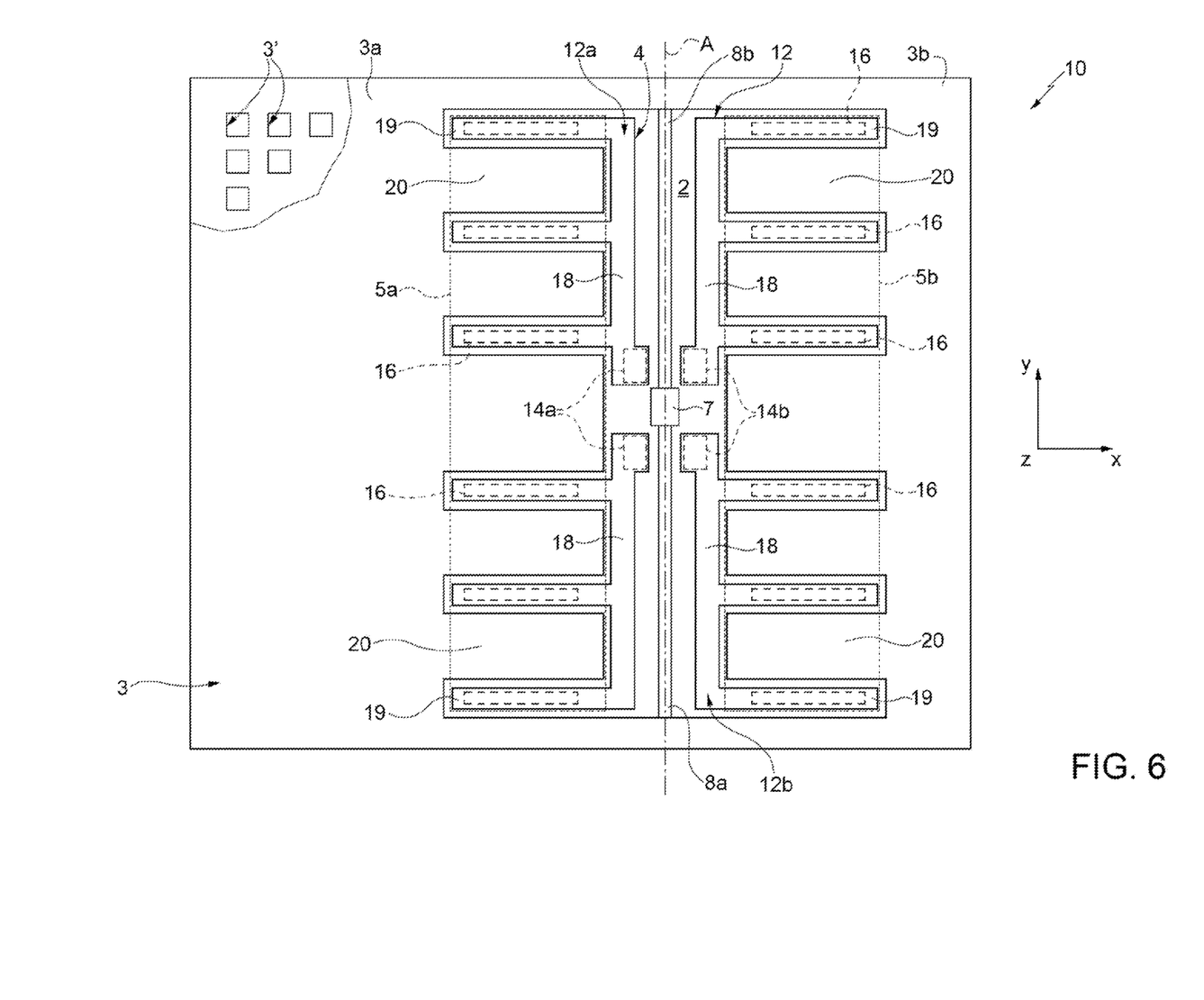
FIG. 6 is a schematic top plane view of a MEMS structure of a z-axis detection device, according to a variant of the present solution.

A different embodiment of the detection structure 10, shown in FIG. 6, envisages that the central body 18 of each suspension portion 12a, 12b of the suspension structure 12 has a pair of respective first anchorage regions 14a and 14b, arranged in the proximity of the central anchorage element 7, on opposite sides thereof with respect to the first axis x. The pairs of first anchorage regions 14a, 14b are further arranged on opposite sides with respect to the axis of rotation A.

In other words, the first anchorage regions 14a, 14b are in this case arranged at the vertices of a square, or rectangle (in plane view), with the central anchorage element 7 arranged at the center of the same square, or rectangle.

In the same embodiment, each suspension portion 12a may further be divided into two distinct halves, each coupled to a respective anchorage region 14a, 14b.

In a different embodiment (not illustrated), the suspension structure 12 could be provided at a different height along the vertical axis z (with respect to the substrate 2) as compared to the inertial mass 3; for example, it could be arranged underneath the inertial mass 3, which could in this case have a "full", not-combfingered, structure.

The number of fixed electrodes 5a, 5b could vary with respect to what has been illustrated, it being possible in fact to have a greater number of electrodes (for example, short-circuited with one another according to appropriate arrangements of electrodes designed to form with the inertial mass 3, as a whole, the two detection capacitors $C_1$, $C_2$), or else also a single fixed electrode, in the case where a differential-detection scheme is not adopted.

In particular, also in the case where a different number of detection electrodes were present, these would be anchored to the substrate 2 in the proximity of the central anchorage element 7, by the suspension structure 12, suspended over the substrate 2, as previously discussed in detail.

Moreover, the shape of the detection electrodes 5a, 5b could vary with respect to what has been previously illustrated.

It is clear that the solution described may advantageously be applied also to different types of sensors where the detection of a capacitive variation along the axis z is desired, for example in gyroscopes, microphones, or pressure sensors.

Finally, it is evident that the solution described applies in an equivalent way to uniaxial sensors or biaxial or triaxial sensors that are able to detect accelerations (or different quantities) also along the first axis x and/or the second axis y (these sensors being provided for this purpose with further mobile and fixed electrodes, which are obtained and arranged in a per se known manner).

The various embodiments described above can be combined to provide further embodiments. These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. A microelectromechanical detection structure comprising:
   a substrate having a top surface extending in a plane and a central region;
   a central anchorage element fixed with respect to said substrate and arranged in the central region;
   a detection-electrode arrangement of fixed electrodes;
   an inertial mass suspended above said substrate and at least partially facing said detection-electrode arrangement, the inertial mass capacitively coupled to said detection-electrode arrangement;
   elastic elements coupling the inertial mass to the central anchorage element and configured to support said inertial mass so that the inertial mass is free to rotate about an axis of rotation as a function of a quantity to be detected along a vertical axis that is transverse to said plane, the central anchorage element being arranged at said axis of rotation;
   a first anchorage element coupled to the substrate in the central region;
   a suspension structure coupled to the first anchorage element and suspended over the substrate; and
   a second anchorage element coupled to the suspension structure and to the detection-electrode arrangement without being directly coupled to the substrate, the second anchorage element being positioned above the detection-electrode arrangement and below the suspension structure, the second anchorage element and the suspension structure being configured to support the detection-electrode arrangement in a position that is suspended above the substrate and below the inertial mass.

2. The structure according to claim 1, wherein:
   said inertial mass has an opening that defines a window, and said first anchorage element is arranged in a position corresponding to said window and laterally with respect to said central anchorage element; and
   said first anchorage element extends vertically between the top surface of said substrate and said suspension structure, and said second anchorage element extends vertically between said suspension structure and a respective detection electrode of said detection-electrode arrangement of the fixed electrodes.

3. The structure according to claim 2, wherein:
   said elastic elements define said axis of rotation;
   a median axis of said first anchorage element is arranged at a first distance from said axis of rotation; and
   a median axis of said detection electrode is arranged at a second distance from said axis of rotation, the first distance being smaller than the second distance.

4. The structure according to claim 3, wherein a ratio between said first distance and said second distance is between ⅙ and ½.

5. A microelectromechanical detection structure comprising:
   a substrate having a top surface extending in a plane and a central region;
   a central anchorage element fixed with respect to said substrate and arranged in the central region;
   a detection-electrode arrangement of fixed electrodes;
   an inertial mass suspended above said substrate and at least partially facing said detection-electrode arrangement, the inertial mass capacitively coupled to said detection-electrode arrangement;
   elastic elements coupling the inertial mass to the central anchorage element and configured to support said inertial mass so that the inertial mass is free to rotate about an axis of rotation as a function of a quantity to be detected along a vertical axis that is transverse to said plane, the central anchorage element being arranged at said axis of rotation;
   a first anchorage element coupled to the substrate in the central region;
   a suspension structure coupled to the first anchorage element and suspended over the substrate, wherein said suspension structure includes a plurality of arms that depart in a transverse direction from a body, the suspension structure comprising a plurality of second anchorage elements that are coupled to at least some of said arms and to the detection-electrode arrangement, the plurality of second anchorage elements being designed to support a respective detection electrode of said detection-electrode arrangement below said arms, such that the detection-electrode arrangement is suspended above the substrate and below the inertial mass.

6. The structure according to claim 5, wherein said inertial mass has portions combfingered to said arms of said suspension structure.

7. The structure according to claim 5, wherein each of said arms carries a respective second anchorage element towards the respective detection electrode of said detection-electrode arrangement.

8. The structure according to claim 1, wherein:
   said detection-electrode arrangement comprises a first detection electrode and a second detection electrode that are arranged on opposite sides with respect to said axis of rotation; and
   said suspension structure comprises a first suspension portion and a second suspension portion that are arranged on opposite sides, and symmetrically, with respect to said axis of rotation and are designed to support the first and second detection electrodes, respectively, suspended above said substrate and below said inertial mass.

9. The structure according to claim 1, wherein said suspension structure is anchored to said substrate via at least one pair of first anchorage elements arranged alongside said central anchorage element on opposite sides along said axis of rotation with respect to said central anchorage element.

10. The structure according to claim 1, wherein said inertial mass has internally a window that defines a first portion of the inertial mass and a second portion of the inertial mass, the first and second portions arranged on opposite sides with respect to the axis of rotation, and said detection-electrode arrangement comprises a first detection electrode and a second detection electrode that face, respectively, said first portion and said second portion of said inertial mass in such a way so as to form a first detection capacitor and a second detection capacitor, respectively.

11. A microelectromechanical sensor comprising:
   a microelectromechanical detection structure including:
     a substrate having a top surface and a central area;
     a central anchorage element fixed to said substrate in the central area;
     an inertial mass suspended above said substrate;
     elastic elements coupling the inertial mass to the central anchorage element and configured to support said inertial mass so that the inertial mass is free to rotate about an axis of rotation in response to an acceleration;

detection electrodes suspended above the substrate and below the inertial mass;

a first anchor fixed to the substrate in the central area;

a suspension structure having a first portion coupled to the first anchor and a second portion suspended over the substrate; and a second anchor coupled to the second portion of the suspension structure and to the detection electrodes without being directly coupled to the substrate, the second anchor being positioned between a detection electrode of the detection electrodes and the suspension structure in a direction that is transverse to the top surface of the substrate, the second anchor and the suspension structure being configured to support the detection electrodes in a position that is suspended between the substrate and the inertial mass; and an electronic reading circuit electrically coupled to said microelectromechanical detection structure.

12. The sensor according to claim 11, wherein the sensor is a z-axis accelerometer designed to detect an acceleration directed along an axis that is perpendicular to the top surface of the substrate.

13. An electronic device comprising:

a microelectromechanical sensor including:
a substrate having a top surface extending in a plane;
a central anchorage element fixed to said substrate at a central region;
an inertial mass suspended above said substrate;
elastic elements coupling the inertial mass to the central anchorage element and configured to support said inertial mass so that the inertial mass is free to rotate about an axis of rotation in response to an acceleration;
fixed detection electrodes suspended above the substrate and below the inertial mass;
a first anchorage attached to the substrate at the central region of the substrate;
a suspension structure coupled to the first anchorage and suspended by the first anchorage, the suspension structure having a bottom surface facing the substrate; and
a second anchorage coupled to the suspension structure and the fixed detection electrodes without being directly coupled to the substrate, the second anchorage being positioned between a fixed detection electrode of the fixed detection electrodes and the suspension structure in a direction that is transverse to the bottom surface of the suspension structure, the second anchorage and the suspension structure being configured to support the fixed detection electrodes in a position that is suspended between the substrate and the inertial mass;
an electronic reading circuit electrically coupled to said microelectromechanical detection structure; and
a microprocessor unit electrically coupled to said electronic reading circuit.

14. The electronic device according to claim 13, wherein the electronic device is at least one of a mobile phone, a PDA (Personal Digital Assistant), a portable computer, a digital audio player with voice-recording capacity, a photographic-camera, video camera, and a control device for videogames.

15. A process for manufacturing a microelectromechanical detection structure, the process comprising:

providing a substrate having a top surface extending in a plane and a central region;

forming a detection-electrode arrangement of suspended electrodes;

forming an inertial mass suspended above said substrate, the inertial mass at least partially facing said detection-electrode arrangement;

forming elastic elements coupling said inertial mass to a central anchorage element fixed in the central region of the substrate, the elastic elements supporting the inertial mass so that it is free to rotate about an axis of rotation as a function of a quantity to be detected along a vertical axis that is transverse to said plane, the central anchorage element being arranged at said axis of rotation; and forming a suspension structure configured to support said detection-electrode arrangement suspended above said substrate and underneath said inertial mass, said suspension structure being anchored to said substrate by at least one first anchorage, and said detection-electrode arrangement being anchored to said suspension structure by at least one second anchorage that is not coupled directly to the substrate, the at least one second anchorage being above the detection-electrode arrangement and below the suspension structure.

16. The process according to claim 15, further comprising forming a through opening in the inertial mass.

17. The process according to claim 15, wherein the microelectromechanical detection structure is a z-axis accelerometer that detects an acceleration directed along the vertical axis.

* * * * *